United States Patent [19]

Harsch et al.

[11] Patent Number: 4,733,326
[45] Date of Patent: Mar. 22, 1988

[54] PROTECTIVE ARRANGEMENT FOR AN ELECTROMAGNETIC LOAD

[75] Inventors: Klaus Harsch, Ditzingen; Wolfgang Kosak, Möglingen; Peter Werner, Wiernsheim, all of Fed. Rep. of Germany

[73] Assignee: Robert Bosch GmbH, Stuttgart, Fed. Rep. of Germany

[21] Appl. No.: 852,356

[22] Filed: Apr. 15, 1986

[30] Foreign Application Priority Data

May 15, 1985 [DE] Fed. Rep. of Germany ....... 3517490

[51] Int. Cl.$^4$ .............................................. H01H 47/00
[52] U.S. Cl. .................................... 361/159; 123/490
[58] Field of Search ....................... 361/159; 123/490; 251/129.15

[56] References Cited

U.S. PATENT DOCUMENTS

| | | | |
|---|---|---|---|
| 3,183,412 | 5/1965 | Arends | 361/159 |
| 3,705,333 | 12/1972 | Galetto et al. | 361/159 |
| 4,161,306 | 7/1979 | Brune et al. | 251/129.15 |
| 4,618,908 | 10/1986 | Anttila | 123/490 |

Primary Examiner—L. T. Hix
Assistant Examiner—David Porterfield
Attorney, Agent, or Firm—Walter Ottesen

[57] ABSTRACT

A protective arrangement for an electromagnetic load is disclosed. In this protective arrangement, the load and a control transistor form a series circuit from the battery voltage to ground and a series circuit of a free-wheeling transistor and a free-wheeling diode is connected in parallel with the load. By coupling the base of the free-wheeling transistor to ground, this transistor is made continuously conductive provided that the polarity of the supply voltage is correct, whereas, this free-wheeling transistor blocks if the supply voltage polarity is incorrect. This assures that none of the components is in danger of being destroyed in the event that the polarity of the supply voltage is incorrect.

10 Claims, 1 Drawing Figure

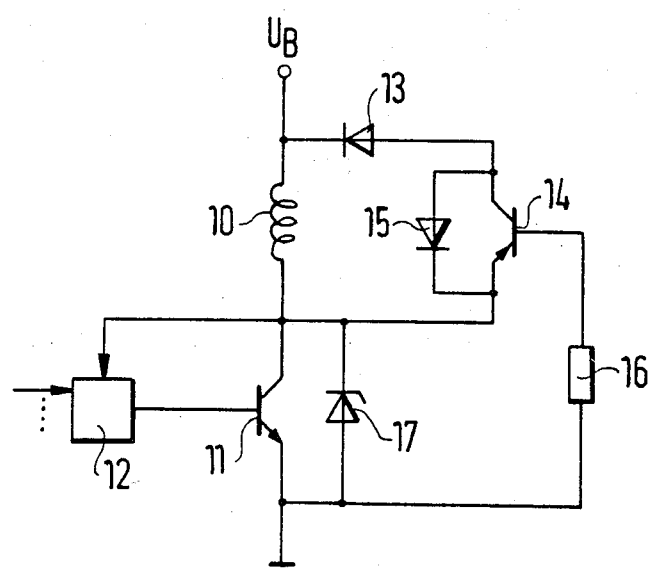

PROTECTIVE ARRANGEMENT FOR AN ELECTROMAGNETIC LOAD

FIELD OF THE INVENTION

The invention relates to a protective arrangement for an electromagnetic consumer load. The protective arrangement includes a supply voltage for the electromagnetic load and a switching device connecting the supply voltage and the load. The protective arrangement further includes a component switched in parallel with the load that effects a free-wheeling of the electromagnetic load.

BACKGROUND OF THE INVENTION

It is known to protect an electromagnetic load from incorrect polarity of the operating voltage supplied to it by inserting protective diodes into the collector circuit of the transistor that switches the load on and off. This has the disadvantage, however, that the voltage available to the load is diminished by the amount of the diode voltage. It is also known to protect the electromagnetic load from an incorrect supply voltage polarity by using an actively controlled free-wheeling circuit. This necessitates great expense for components, however, as well as exact triggering of the transistor that switches the load on and off and of the transistor that switches the free-wheeling circuit on and off. Problems also arise in the above-described systems with the heat losses that occur in the protective arrangements, especially with high values of inductance of the electromagnetic load.

SUMMARY OF THE INVENTION

It is an object of the invention to provide a protective arrangement for an electromagnetic load which reliably protects against incorrect polarity and is usable in a wide variety of applications with a minimum of heat loss, and which does not reduce the voltage available to the load. This is attained by providing, in series with the switching device connected in parallel to the load, a second switching device that switches the free-wheeling circuit on and off in dependence upon the polarity of the supply voltage. Because of the simple circuit arrangement of the invention, components already available in the marketplace can be used, thereby effecting a cost reduction as compared with known arrangements for the same purpose.

BRIEF DESCRIPTION OF THE DRAWING

The invention will now be described with reference to the single figure of the drawing wherein the circuit configuration of an embodiment of the protective arrangement according to the invention is shown.

DESCRIPTION OF THE PREFERRED EMBODIMENTS OF THE INVENTION

In the drawing, an electromagnetic load 10 and a control transistor 11 comprise a series circuit extending from a battery voltage $U_B$ to ground. The base of the control transistor 11 is connected to a control unit 12, which switches the control transistor 11 on and off in dependence upon the input signals applied to this control unit 12. One of the input signals of the control unit 12 is the potential of the circuit node between the electromagnetic load 10 and the control transistor 11.

Connected in parallel with the electromagnetic load 10 is the series circuit of a free-wheeling diode 13 and a free-wheeling transistor 14, the cathode of the free-wheeling diode 13 being connected to the battery voltage $U_B$. The free-wheeling transistor 14 is a transistor of the pnp type. Parallel to the collector-emitter path of the free-wheeling transistor 14, there is a further protective diode 15, the anode of which is connected to the anode of the free-wheeling diode 13. The base of the free-wheeling transistor 14 is connected to ground via a resistor 16.

Finally, a Zener protective diode 17, the anode of which is connected to ground, is connected in parallel to the collector-emitter path of the control transistor 11. The collector-emitter path of transistor 11 leads from the electromagnetic load 10 to ground.

During normal operation, the control transistor 11 is switched on and off by the control unit 12, so that with saturated conduction of the control transistor 11, a current flows through the electromagnetic load 10; whereas, when the control transistor 11 is in the blocking state, after the free wheeling of the load 10, no further current flows through the latter. The free wheeling of the electromagnetic load 10 takes place via the free-wheeling transistor 14 and the free-wheeling diode 13. This is possible because the free-wheeling transistor 14, as a consequence of the resistor 16 that is connected to ground, is continuously driven and is made conductive in the free-wheeling state, that is, when the control transistor 11 blocks.

To prevent the free-wheeling transistor 14 from becoming overloaded by the switching on and off of the control transistor 11, the transistor 14 is bridged by the protective diode 15. To provide still more extensive protection of the free-wheeling transistor 14, it is particularly advantageous to use as the free-wheeling diode 13, a so-called "fast-recovery" diode. The Zener protective diode 17, by means of which especially the occurring voltage peaks are diverted, serves to protect the control transistor 11. Finally, by supplying the collector potential of the control transistor 11 to the control unit 12, it is also possible to attain short-circuit monitoring of the entire circuit within the control unit 12.

If the entire circuit is incorrectly connected to the battery voltage $U_B$, that is, if the emitter of the control transistor 11 is connected to the potential of the battery voltage $U_B$ and the cathode of the free-wheeling diode 13 is connected to ground, the result is that the free-wheeling transistor 14 blocks continuously. As a result, current can no longer flow via the free-wheeling transistor 14 and the free-wheeling diode 13 connected to its output side. Regardless of the switching state assumed by the control transistor 11, in the incorrect operating state described, a current flows from the incorrectly connected battery voltage $U_B$ via the Zener protective diode 17 and the electromagnetic load 10 to ground, the latter also being incorrectly connected. Because of the selected dimensions of the electromagnetic load 10 and of the battery voltage $U_B$, however, this current is normally not excessively high for the electromagnetic load, so there need not be any fear that a component will be destroyed.

The overall result, with the circuit arrangement described above, is that even if there is a defective or incorrect connection of the battery voltage with the circuit arrangement, it is assured that the destruction of the components of the circuit need not be feared. This is attained in particular by providing a transistor in the free-wheeling circuit of the electromagnetic load of the circuit arrangement, which transistor is continuously in its conductive state as long as the voltage supply is correct. As a result, only very slight reductions of the voltage available to the load occur with the circuit described, and only negligible heat losses occur in the individual components of the circuit.

It is particularly advantageous to use the entire circuit in the context of open-loop control or closed-loop control of internal combustion engines, in particular for fuel injection and/or for air supply to the combustion chambers of the engine during idling. In this case, it is especially advantageous if the electromagnetic load is an appropriately configured solenoid valve.

It is understood that the foregoing description is that of the preferred embodiments of the invention and that various changes and modifications may be made thereto without departing from the spirit and scope of the invention as defined in the appended claims.

What is claimed is:

1. A protective arrangement for an electromagnetic consumer load, the protective arrangement comprising:
   voltage supply means for said load;
   first switching means for connecting said electromagnetic load to said voltage supply means and being switchable between a conductive state during which a current flows through said electromagnetic load and a blocking state in response to which a back emf develops across said electromagnetic load;
   a free-wheeling circuit connected in parallel to said load, said free-wheeling circuit including:
   a free-wheeling component and second switching means connected in series with said free-wheeling component;
   said second switching means being nonresponsive during the conductive state of said first switching means and being responsive to a change from said conductive state to said blocking state of said first switching means for rendering said free-wheeling circuit conductive in response to said back emf so as to place said electromagnetic load into the free-wheeling condition when said voltage supply means has a first polarity and for rendering said free-wheeling circuit non-conductive irrespective of whether said first switching means is in the conductive or blocking states when said voltage supply means has a second polarity opposite to said first polarity.

2. The protective arrangement of claim 1, said second switching means comprising a transistor connected in series with said circuit component means.

3. The protective arrangement of claim 1, comprising a protective device connected in parallel with said second switching means.

4. The protective arrangement of claim 3, said protective device being a diode.

5. The protective arrangement of claim 1, said circuit component means comprising a diode.

6. The protective arrangement of claim 1, said first switching means comprising a transistor.

7. The protective arrangement of claim 1, comprising a protective device connected in parallel with said first switching means.

8. The protective arrangement of claim 7, said protective device being a Zener diode.

9. The protective arrangement of claim 1, said electromagnetic consumer load being a solenoid valve for metering fuel to an internal combustion engine.

10. The protective arrangement of claim 1, said electromagnetic consumer load being a solenoid valve for metering air to the combustion chambers of an internal combustion engine.

* * * * *

UNITED STATES PATENT AND TRADEMARK OFFICE
CERTIFICATE OF CORRECTION

PATENT NO. : 4,733,326

DATED : March 22, 1988

INVENTOR(S) : Klaus Harsch et al

It is certified that error appears in the above-identified patent and that said Letters Patent is hereby corrected as shown below:

On the title page, under "Abstract" line 9: delete "correct," and substitute -- correct; -- therefor.

In column 2, line 34: delete "37 fast-recovery" and substitute -- "fast-recovery" -- therefor.

Signed and Sealed this

Second Day of August, 1988

Attest:

Attesting Officer

DONALD J. QUIGG

Commissioner of Patents and Trademarks